(12) United States Patent
Park et al.

(10) Patent No.: US 12,707,677 B2
(45) Date of Patent: Aug. 11, 2026

(54) 3D-STACKED SEMICONDUCTOR DEVICE INCLUDING SOURCE/DRAIN REGIONS VERTICALLY ISOLATED FROM EACH OTHER BY STRENGTHENED ISOLATION STRUCTURE

(71) Applicant: SAMSUNG ELECTRONICS CO., LTD., Suwon-si (KR)

(72) Inventors: Keumseok Park, Slingerlands, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 350 days.

(21) Appl. No.: 18/239,552

(22) Filed: Aug. 29, 2023

(65) Prior Publication Data

US 2024/0379780 A1 Nov. 14, 2024

Related U.S. Application Data

(60) Provisional application No. 63/465,152, filed on May 9, 2023.

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 30/43* (2025.01);
(Continued)

(58) Field of Classification Search
CPC ............. H10D 30/6729; H10D 30/014; H10D 30/6757; H10D 84/013; H10D 62/121;
(Continued)

(56) References Cited

U.S. PATENT DOCUMENTS 10,734,224 B2 8/2020 Smith et al.
11,450,663 B2 9/2022 Chen et al.
(Continued)

*Primary Examiner* — Michael Jung
(74) *Attorney, Agent, or Firm* — Myers Bigel, P.A.

(57) ABSTRACT

Provided is a semiconductor device which includes: a $1^{st}$ source/drain region connected to a $1^{st}$ channel structure; a $2^{nd}$ source/drain region, above the $1^{st}$ source/drain region, connected to a $2^{nd}$ channel structure above the $1^{st}$ channel structure; a channel isolation layer between the $1^{st}$ channel structure and the $2^{nd}$ channel structure; a source/drain isolation layer between the $1^{st}$ source/drain region and the $2^{nd}$ source/drain region; and a blocking structure between the channel isolation layer and the source/drain isolation layer, wherein an entire width of the blocking structure in a channel-length direction is vertically below a lateral edge portion of the $2^{nd}$ source/drain region.

18 Claims, 12 Drawing Sheets

(51) Int. Cl.

| | |
|---|---|
| ***H10D 30/43*** | (2025.01) |
| ***H10D 62/10*** | (2025.01) |
| ***H10D 84/01*** | (2026.01) |
| ***H10D 84/03*** | (2025.01) |
| ***H10D 84/83*** | (2025.01) |
| ***H10D 88/00*** | (2026.01) |

(52) U.S. Cl.

CPC ..... *H10D 30/6735* (2025.01); *H10D 30/6757* (2025.01); *H10D 62/121* (2025.01); *H10D 84/0128* (2025.01); *H10D 84/013* (2025.01); *H10D 84/038* (2025.01); *H10D 84/83* (2025.01); *H10D 88/00* (2025.01)

(58) Field of Classification Search

CPC .... H10D 88/00; H10D 30/6735; H10D 30/43; H10D 84/0128; H10D 84/038; H10D 84/83

See application file for complete search history.

(56) References Cited

U.S. PATENT DOCUMENTS

| | | | | |
|---|---|---|---|---|
| 11,573,798 | B2 * | 2/2023 | Lilak | H10D 84/0147 |
| 11,594,535 | B2 | 2/2023 | Gardner et al. | |
| 2023/0065715 | A1 | 3/2023 | Xie et al. | |
| 2023/0076270 | A1 | 3/2023 | Kim et al. | |
| 2023/0132749 | A1 | 5/2023 | Thomas et al. | |
| 2024/0297228 | A1 * | 9/2024 | Loh | H10D 84/038 |
| 2024/0321990 | A1 * | 9/2024 | Shih | H10D 30/6735 |

* cited by examiner 10 (20)
10-1
10-2
10-3
105
151
150
150
150
I
I'
D1
D2
D3

Figure 5:
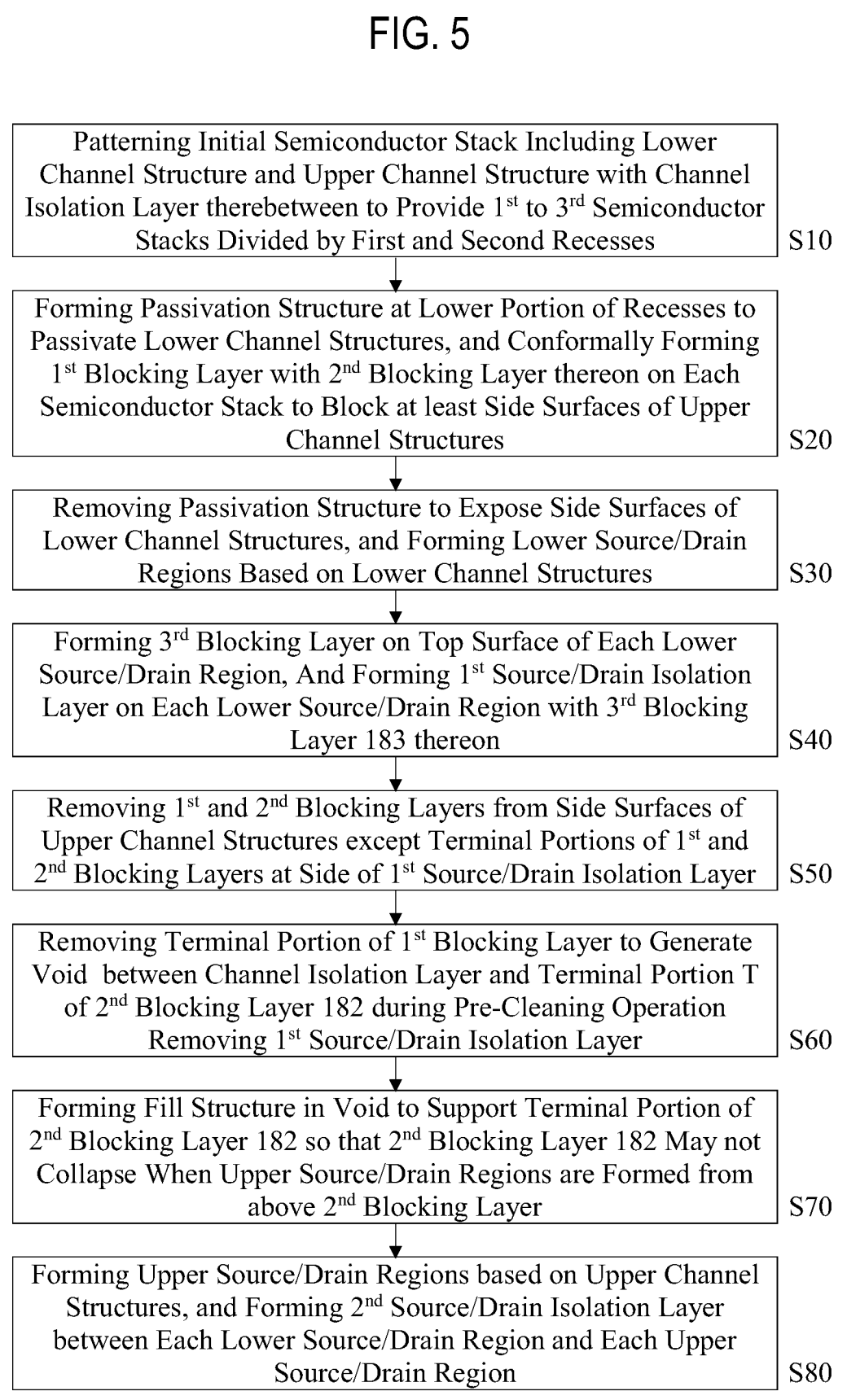

Patterning Initial Semiconductor Stack Including Lower Channel Structure and Upper Channel Structure with Channel Isolation Layer therebetween to Provide 1st to 3rd Semiconductor Stacks Divided by First and Second Recesses — S10

Forming Passivation Structure at Lower Portion of Recesses to Passivate Lower Channel Structures, and Conformally Forming 1st Blocking Layer with 2nd Blocking Layer thereon on Each Semiconductor Stack to Block at least Side Surfaces of Upper Channel Structures — S20

Removing Passivation Structure to Expose Side Surfaces of Lower Channel Structures, and Forming Lower Source/Drain Regions Based on Lower Channel Structures — S30

Forming 3rd Blocking Layer on Top Surface of Each Lower Source/Drain Region, And Forming 1st Source/Drain Isolation Layer on Each Lower Source/Drain Region with 3rd Blocking Layer 183 thereon — S40

Removing 1st and 2nd Blocking Layers from Side Surfaces of Upper Channel Structures except Terminal Portions of 1st and 2nd Blocking Layers at Side of 1st Source/Drain Isolation Layer — S50

Removing Terminal Portion of 1st Blocking Layer to Generate Void between Channel Isolation Layer and Terminal Portion T of 2nd Blocking Layer 182 during Pre-Cleaning Operation Removing 1st Source/Drain Isolation Layer — S60

Forming Fill Structure in Void to Support Terminal Portion of 2nd Blocking Layer 182 so that 2nd Blocking Layer 182 May not Collapse When Upper Source/Drain Regions are Formed from above 2nd Blocking Layer — S70

Forming Upper Source/Drain Regions based on Upper Channel Structures, and Forming 2nd Source/Drain Isolation Layer between Each Lower Source/Drain Region and Each Upper Source/Drain Region — S80

3D-STACKED SEMICONDUCTOR DEVICE INCLUDING SOURCE/DRAIN REGIONS VERTICALLY ISOLATED FROM EACH OTHER BY STRENGTHENED ISOLATION STRUCTURE

CROSS-REFERENCE TO THE RELATED APPLICATION

This application is based on and claims priority from U.S. Provisional Application No. 63/465,152 filed on May 9, 2023 in the U.S. Patent and Trademark Office, the disclosure of which is incorporated herein in its entirety by reference.

BACKGROUND

1. Field

Apparatuses and methods related to the disclosure relate to a three-dimensionally-stacked (3D-stacked) or multi-stack semiconductor device in which a lower source/drain region and an upper source/drain region are isolated from each other through a strengthened isolation structure.

2. Description of the Related Art

A 3D-stacked semiconductor device including a lower transistor and an upper transistor stacked thereon has been introduced in response to increased demand for an integrated circuit having a high device density and performance. Each of the lower and upper transistors may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure and a gate structure surrounding all four surfaces of each of the nanosheet channel layers. The nanosheet transistor is referred to as gate-all-around (GAA) transistor, or as a multi-bridge channel field-effect transistor (MBCFET).

However, formation of an upper source/drain region and a lower source/drain region of the 3D-stacked semiconductor device presents various challenges including difficulties in isolating the two source/drain regions from each other. This issue arises because the lower source/drain region is vertically overlapped by the upper source/drain region in the 3D-stacked semiconductor device.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a multi-stack semiconductor device having an improved isolation structure between lower and upper channel structures and inner spacers formed based on the isolation structure, and a method of manufacturing the same.

According to an embodiment, there is provided a semiconductor device which may include: a $1^{st}$ source/drain region connected to a $1^{st}$ channel structure; a $2^{nd}$ source/ drain region, above the $1^{st}$ source/drain region, connected to a $2^{nd}$ channel structure above the $1^{st}$ channel structure; a channel isolation layer between the $1^{st}$ channel structure and the $2^{nd}$ channel structure; a source/drain isolation layer between the $1^{st}$ source/drain region and the $2^{nd}$ source/drain region; and a blocking structure between the channel isolation layer and the source/drain isolation layer, wherein an entire width of the blocking structure in a channel-length direction is vertically below a lateral edge portion of the $2^{nd}$ source/drain region.

According to an embodiment, a side surface of the blocking structure contacting the channel isolation layer may be vertically aligned with a side surface of the $2^{nd}$ channel structure.

According to an embodiment, there is provided a semiconductor device which may include: a $1^{st}$ source/drain region connected to a $1^{st}$ channel structure; a $2^{nd}$ source/drain region, above the $1^{st}$ source/drain region, connected to a $2^{nd}$ channel structure above the $1^{st}$ channel structure; a channel isolation layer between the $1^{st}$ channel structure and the $2^{nd}$ channel structure; a source/drain isolation layer between the $1^{st}$ source/drain region and the $2^{nd}$ source/drain region; and a blocking structure between the channel isolation layer and the source/drain isolation layer, wherein the blocking structure includes a $1^{st}$ portion and a $2^{nd}$ portion contacting each other with a structural boundary therebetween.

According to an embodiment, the $1^{st}$ and $2^{nd}$ portions of the blocking structure may include a same material such as a silicon nitride.

According to an embodiment, the blocking structure may not be vertically overlapped by the $1^{st}$ or $2^{nd}$ channel structure.

According to embodiments, there is provided a method of manufacturing a semiconductor device. The method may include: providing a semiconductor stack comprising a $1^{st}$ channel structure, a channel isolation layer and a $2^{nd}$ channel structure stacked in this order on a substrate; forming a $1^{st}$ source/drain region based on the $1^{st}$ channel structure; forming a blocking structure on a side surface of the channel isolation layer above a lateral edge portion of the $1^{st}$ source/drain region; forming a $2^{nd}$ source/drain region based on the $2^{nd}$ channel structure from above the blocking structure; and forming an source/drain isolation layer between the $1^{st}$ source/drain region and the $2^{nd}$ source/drain region, wherein an entire width of the blocking structure a channel-length direction is vertically below a lateral edge portion of the $2^{nd}$ source/drain region.

According to an embodiment, the $1^{st}$ portion may be formed before the $1^{st}$ source/drain region is formed, and the $2^{nd}$ portion may be formed after the $1^{st}$ source/drain region is formed.

BRIEF DESCRIPTION OF DRAWINGS

Example embodiments of the inventive concept will be more clearly understood from the following detailed description taken in conjunction with the accompanying drawings in which:

FIGS. 2A-2L illustrate intermediate semiconductor devices obtained after respective steps of forming the lower source/drain regions and the upper source/drain regions for a 3D-stacked semiconductor device based on the intermediate semiconductor device of FIG. 1, according to embodiments;

FIG. 4 illustrates an enlarged view of a portion A of the intermediate semiconductor device shown in FIG. 3D;

FIG. 5 illustrates a flowchart describing a method of forming lower source/drain regions and upper source/drain regions for a 3D-stacked semiconductor device, according to an embodiment.

DETAILED DESCRIPTION OF EXAMPLE EMBODIMENTS

Figure 1:
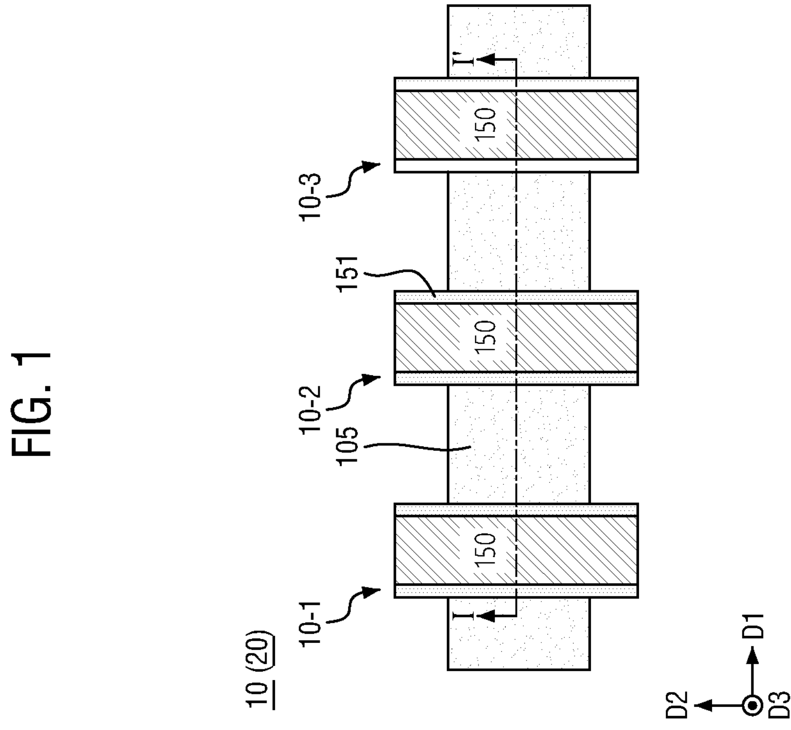
FIG. 1 illustrates a top plan view of an intermediate semiconductor device provided before lower source/drain regions and upper source/drain regions are formed to manufacture a 3D-stacked semiconductor device, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. For example, the disclosure omits descriptions of materials of a substrate (e.g., silicon, germanium, etc.), a source/drain region (e.g., silicon doped with p-type or n-type impurities), and a gate structure (e.g., copper (Cu), aluminum (Al), cobalt (Co), tungsten (W), titanium (Ti), tantalum (Ta) or their combination).

FIG. 1 illustrates a top plan view of an intermediate semiconductor device provided before lower source/drain regions and upper source/drain regions above the lower source/drain regions are formed to manufacture a 3D-stacked semiconductor device, according to an embodiment. FIGS. 2A-2L illustrate intermediate semiconductor devices obtained after respective steps of forming the lower source/drain regions and the upper source/drain regions for a 3D-stacked semiconductor device based on the intermediate semiconductor device of FIG. 1, according to embodiments.

Figures 2A, 2B:
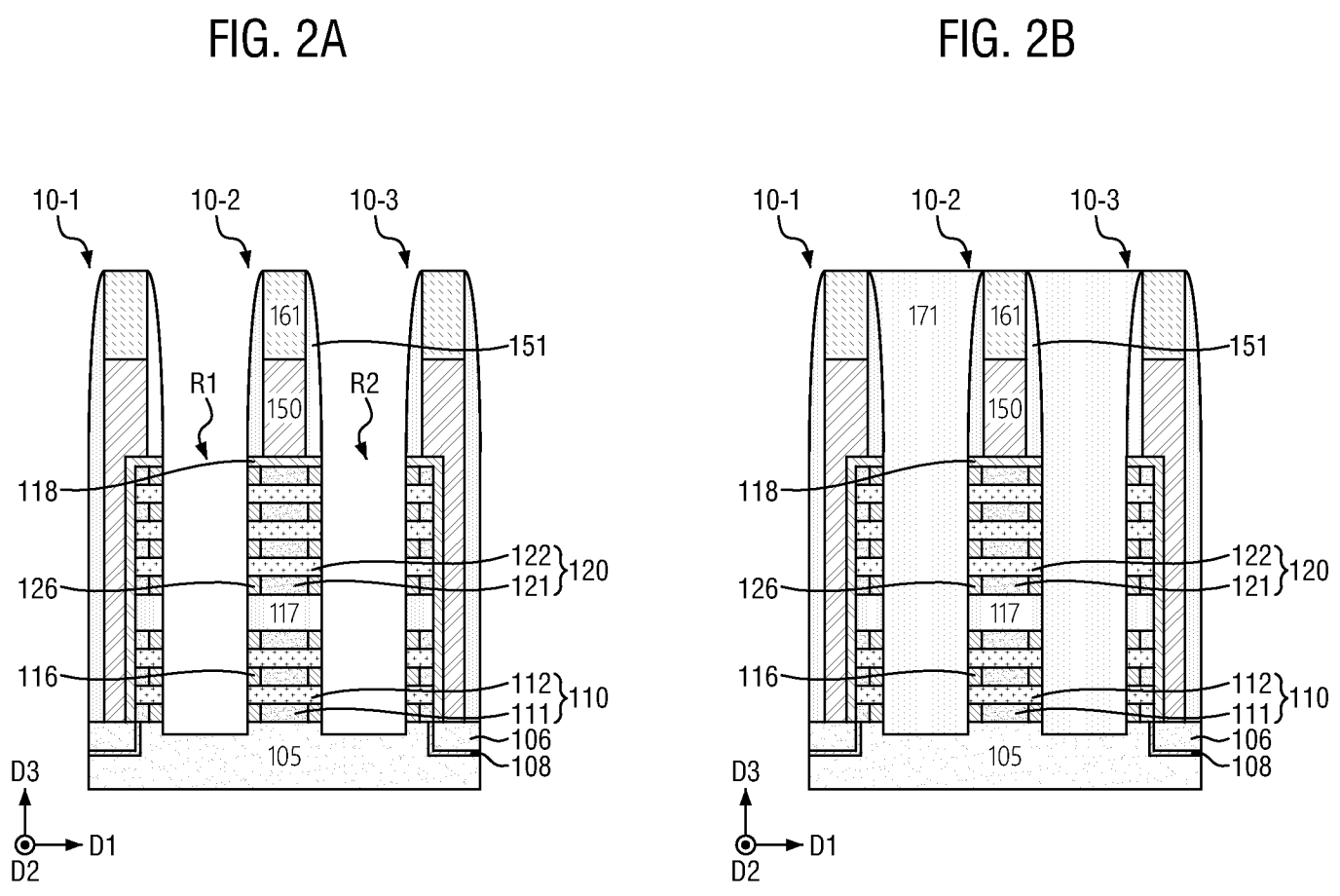
Figure 2D:
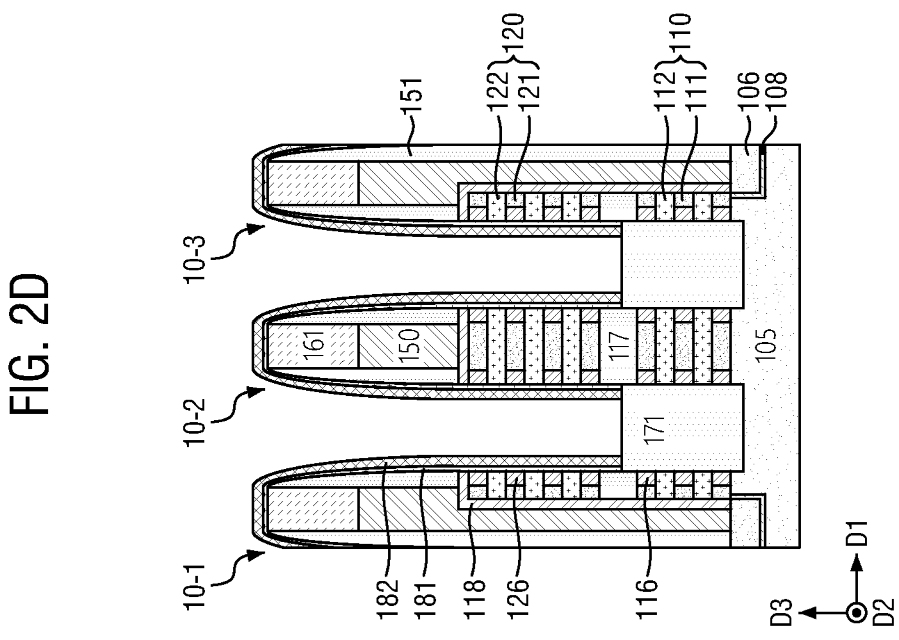

FIG. 2A is a cross-section view of the intermediate semiconductor device of FIG. 1 along a line I-I' shown therein in a D1 direction, and FIGS. 2B through 2L are respective views along the same cross-sections in the D1 direction. Here, the D1 direction is a channel-length direction, and the D2 direction is a channel-width direction that intersects the D1 direction.

Referring to FIGS. 1 and 2A, an intermediate semiconductor device 10 includes a plurality of semiconductor stacks 10-1, 10-2 and 10-3 on a substrate 105. These three channel stacks may be obtained by dividing a single initial semiconductor stack formed on the substrate 105 through, for example, operations of lithography, masking and top-down etching, to provide two recesses R1 and R2 exposing a top surface of the substrate 105. In the two recesses R1 and R2 will be formed lower source/drain regions and upper source/drain regions in a later step of manufacturing a 3D-stacked semiconductor device. The lower source/drain regions may form a lower transistor, and the upper source/drain regions may form an upper transistor in the 3D-stacked semiconductor device.

The initial semiconductor stack, before being divided into the three semiconductor stacks 10-1, 10-2 and 10-3, may be formed by epitaxially growing a plurality of lower sacrificial layers 111, lower channel layers 112, upper sacrificial layers 121 and upper channel layers 122 from the substrate 105 in an alternating manner. The sacrificial layers 111 and 121 are referred to as such because these layers will be replaced by a gate structure in a later step. The lower channel layers 112 and the upper channel layers 122 will respectively form a lower channel of a lower transistor and an upper channel of an upper transistor with a channel isolation layer 117 therebetween when a 3D-stacked semiconductor device is completed from the intermediate semiconductor device 10. Herein, the lower sacrificial layers 111 and the lower channel layers 112 are collectively referred to as a lower channel structure 110, and the upper sacrificial layers 121 and the upper channel layers 122 are collectively referred to as an upper channel structure 120.

After the lower channel structure 110 and the upper channel structure 120 are stacked with the channel isolation layer 117 therebetween to form the initial semiconductor stack, the initial semiconductor stack may be patterned to form a shallow trench isolation (STI) structure 106 that will isolate the intermediate semiconductor device 10 from an adjacent device such as another intermediate semiconductor device. An STI liner 108 may be formed before the STI structure 106 is formed on the substrate 105.

Further, an oxide layer 118 may be formed to surround the patterned semiconductor stack, and a dummy gate structure 150 may be formed on the oxide layer 118. The dummy gate structure 150 along with the sacrificial layers 111 will be replaced by a gate structure for a 3D-stacked semiconductor device in a later step. The oxide layer 118 may be formed to disable the channel structures 110 and 120 partially formed in the semiconductor stacks 10-1 and 10-2 when the 3D-stacked semiconductor device is completed in a later step. However, the semiconductor stacks 10-1 and 10-2 may be used to form lower source/drain regions and upper source/drain regions for the 3D-stacked semiconductor device in a later step.

Hard mask patterns 161 may be formed on the dummy gate structure 150 to perform lithography, masking and top-down etching operations on the initial semiconductor stack. Based on the hard mask patterns 161, the dummy gate structure 150 may be first patterned to form three dummy gate structures 150. A gate spacer 151 may be formed on side surfaces of the hard mask patterns 161 and each of the dummy gate structures 150. The gate spacer 151 will isolate or protect a gate structure which will replace each of the dummy gate structures 150 in a later step from other circuit elements.

Subsequently, the semiconductor stacks 10-1, 10-2 and 10-3 as shown in FIG. 2A may be patterned out with the recesses R1 and R2 therebetween each of which exposes the top surface of the substrate 105 and side surfaces of the lower channel structure 110 and the upper channel structure 120 of the semiconductor stacks 10-1, 10-2 and 10-3.

In addition, side surfaces of the lower sacrificial layers 111 may be etched to form lower inner spacers 116 which will isolate lower source/drain regions to be formed in the recesses R1 and R2 from portions of a gate structure which will replace the lower sacrificial layers 111 in a later step. Similarly, side surfaces of the upper sacrificial layers 121 may be etched to form upper inner spacers 126 which will isolate upper source/drain regions to be formed in the recesses R1 and R2 from portions of the gate structure which will replace the upper sacrificial layers 121 in a later step.

Thus, each of the recesses R1 and R2 may expose side surfaces of the lower channel layers 112, the lower inner spacers 116, the channel isolation layer 117, the upper channel layers 122 and the upper inner spacers 126 which are vertically aligned and coplanar with each other.

The substrate 105 may be a silicon (Si) substrate although it may include other materials such as silicon germanium (SiGe), silicon carbide (SiC), not being limited thereto. Each of the sacrificial layers 111 may include silicon-germanium (SiGe), and each of the channel layers 112 may include silicon (Si). The channel isolation layer 117 may also include SiGe, or a silicon nitride (e.g., SiBCN not being limited thereto). The STI structure 106 may include a silicon oxide (e.g., $SiO_2$ not being limited thereto), and the STI liner 108 may include a silicon nitride (e.g., SiN or $Si_3N_4$ not being limited thereto). The oxide layer 118 may be a silicon oxide layer (e.g., $SiO_2$ not being limited thereto). The dummy gate structure may include polysilicon or amorphous silicon, and the gate spacer may include a silicon nitride (e.g., $Si_3N_4$ not being limited thereto). The hard mask patterns 161 may include a silicon nitride or titanium nitride (e.g., SiN, $Si_3N_4$ or TiN not being limited thereto).

Referring to FIG. 2B, a spin-on-glass (SOG) material may be dispensed in the recesses R1 and R2 to form a passivation structure 171 which, in a next step, will be partially etched down to expose the upper channel structure 120 while protecting the lower channel structure 110 from a subsequent operation. The SOG material may include, for example, a liquid silicate-based material.

After the SOG material is filled in the recesses R1 and R2, the intermediate semiconductor device 10 may be planarized at its top so that top surfaces of the semiconductor stacks 10-1, 10-2 and 103 are coplanar with a top surface of the SOG material filled in the recesses R1 and R2.

Figure 2C:
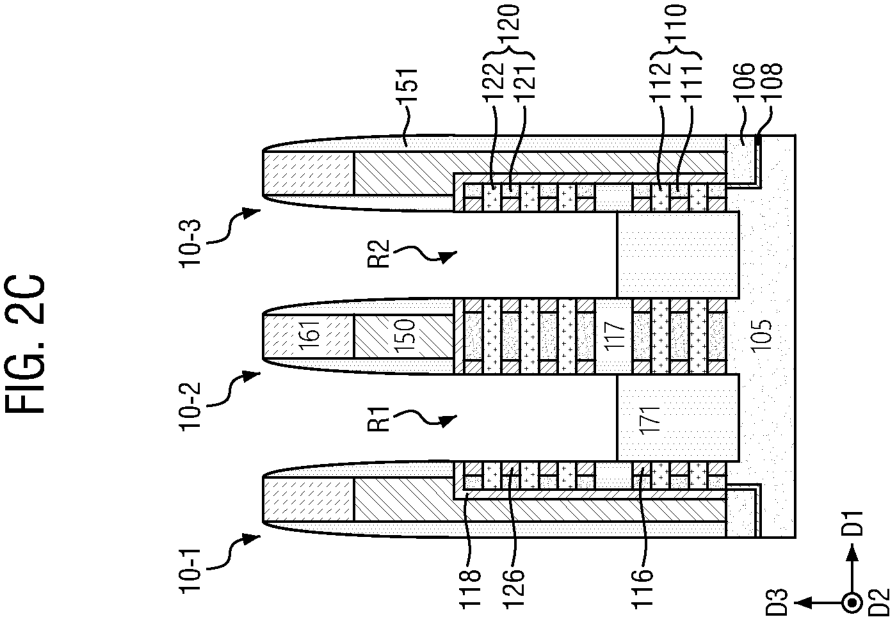

Referring to FIG. 2C, the passivation structure 171 may be partially etched down through, for example, dry etching and/or wet etching, such that a top surface of the passivation structure 171 may be lowered to a level between a top surface and a bottom surface of the channel isolation layer 117, that is, between a top surface of the uppermost lower inner spacer 116 and a bottom surface of the lowermost upper inner spacer 126.

By partially etching down the passivation structure 171 in this manner, the upper channel structure 120 may be exposed again through each of the recesses R1 and R2, while the lower channel structure 110 is protected from a subsequent operation by the passivation structure 171 remaining after the partial etching in this step.

Referring to FIG. 2D, a 1$^{st}$ blocking layer 181 with a 2$^{nd}$ blocking layer 182 thereon may be conformally formed on an outer surface of the semiconductor stacks 10-1, 10-2 and 10-3 obtained in the previous step through, for example, atomic layer deposition (ALD), not being limited thereto.

The ALD may be performed such that the 1$^{st}$ blocking layer 181 is layered on side surfaces of the gate spacer 151 and the upper channel structure 120 is exposed through the recesses R1 and R2. For example, the 1$^{st}$ blocking layer 181 may contact the side surfaces of the gate spacer 151, the oxide layer, 118, the upper channel layers 122 and the upper inner spacers 126 and an upper side surface of the channel isolation layer 117 that are vertically aligned to each other and exposed through each of the recesses R1 and R2 above the top surface of the passivation structure 171. Further, the 2$^{nd}$ blocking layer 182 may be formed on the 1$^{st}$ blocking layer 182. Thus, bottom surfaces of the 1$^{st}$ and 2$^{nd}$ blocking layers 181 and 182 may contact the top surface of the passivation structure 171 in the recesses R1 and R2.

The blocking layers 181 and 182 may protect the upper channel structure 120 when lower source/drain regions are formed at a space provided by removing the remaining passivation structure 171 in a later step. Moreover, the 1$^{st}$ blocking layer 181 may protect the gate spacer 151 in a later step when the 2$^{nd}$ blocking layer 182 is removed.

The 1$^{st}$ blocking layer 181 may include a material such as a silicon oxide (e.g., SiO or $SiO_2$), and the 2$^{nd}$ blocking layer 182 may include a material such as a silicon nitride (e.g., SiN or $Si_3N_4$).

Figures 2E, 2F:
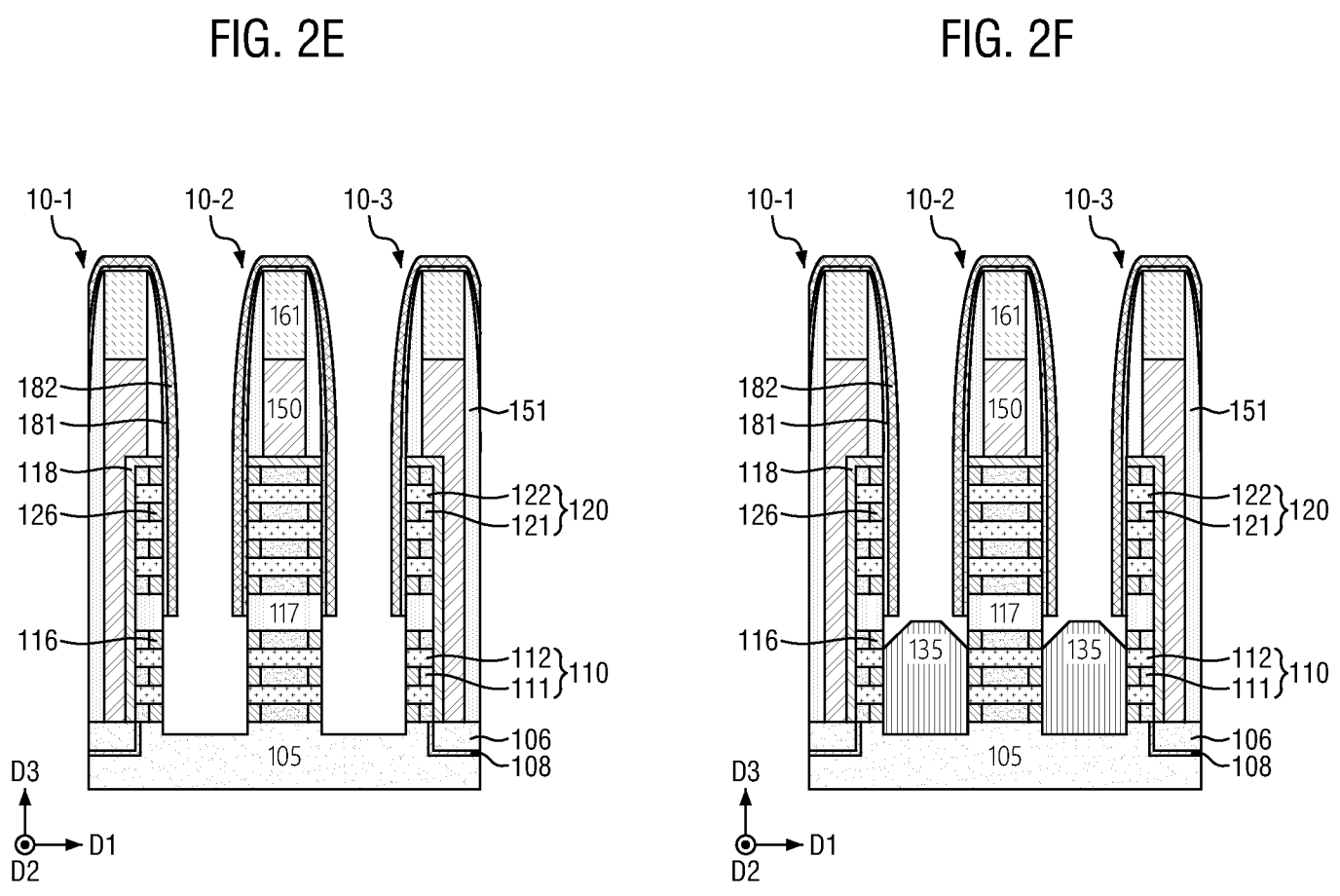

Referring to FIG. 2E, the remaining passivation structure 171 may be removed through, for example, dry etching, wet etching, stripping or ashing to expose the lower channel structure 110 and the top surface of the substrate 105 through each of the recesses R1 and R2 again. At this time, the upper channel structure 120 may be still covered by the blocking layers 181 and 182.

For example, the removal of the passivation structure 171 may expose a lower side surface of the channel isolation layer 117 below the level of the top surface of the passivation structure 171, the side surfaces of the uppermost lower inner spacer 116 and the lower channel layers 111, and the top surface of the substrate 105 through each of the recesses R1 and R2. Further, the removal of the passivation structure 171 may also expose the bottom surfaces of the blocking layers 181 and 182 in each of the recesses R1 and R2.

Referring to FIG. 2F, lower source/drain regions 135 may be formed through, for example, epitaxy based on the substrate 105 and the lower channel layers 112 of the semiconductor stacks 10-1, 10-2 and 10-3 exposed in the recesses R1 and R2. The lower source/drain regions 135 may include the same material, such as silicon, forming the substrate 105 and the lower channel layers 112. Further, the lower source/drain regions 135 may be doped with impurities such as phosphorus (P), arsenic (As), antimony (Sb), etc. when the lower source/drain regions 135 are to be n-type source/drain regions. However, when the lower source/drain regions 135 are to be p-type source/drain regions, they may be doped with boron (B), gallium (Ga), indium (In), etc.

When a 3D-stacked semiconductor device is completed, a current will flow between the lower source/drain regions 135 through the lower channel layers 112 of the semiconductor stack 10-2 to function a lower transistor of the 3D-stacked semiconductor device.

In this step, the epitaxy forming the lower source/drain regions 135 may be selectively performed based on only the lower channel layers 112 and the substrate 105 because the upper channel layers 122 are covered by the blocking layers 181 and 182.

Figures 2G, 2H:
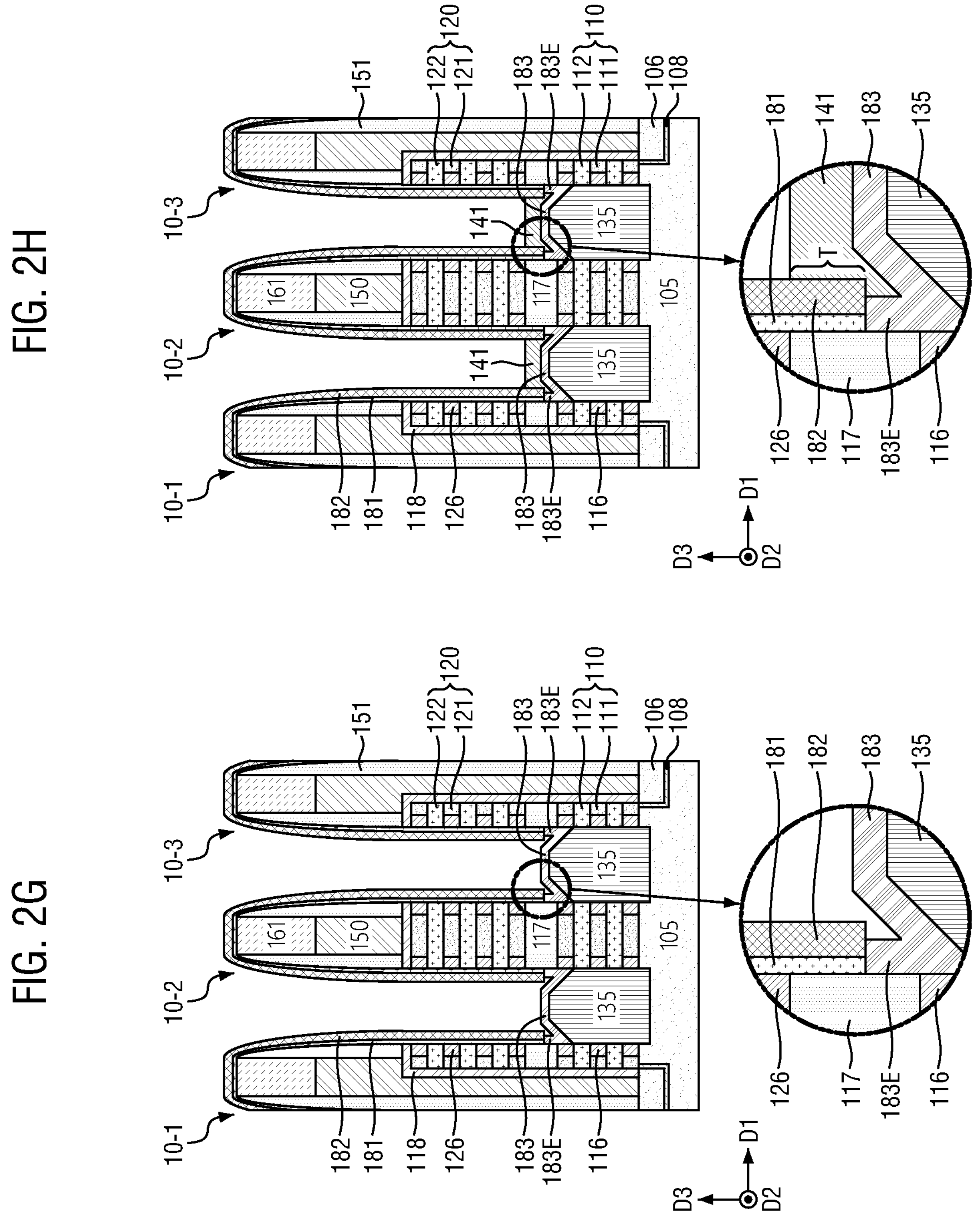

Referring to FIG. 2G, a 3$^{rd}$ blocking layer 183 may be formed on a top surface of each of the lower source/drain regions 135 so that the lower source/drain regions 135 may be protected from a subsequent process of epitaxially growing upper source/drain regions from the upper channel layers 122.

The formation of the 3$^{rd}$ blocking layer 183 may be performed through, for example, atomic layer deposition (ALD) of a silicon nitride (e.g., SiN or $Si_3N_4$), not being limited thereto, on the top surface of the lower source/drain region 135 exposed through each of the recesses R1 and R2. At this time, an end portion 183E of the 3$^{rd}$ blocking layer 183 may be extended to the side surface of the uppermost lower inner spacer 116 and the lower side surface of the channel isolation layer 117 not covered by the blocking layers 181 and 182 and exposed in each of the recess R1 or R2. Further, the end portion 183E may be extended to the bottom surface of the 1$^{st}$ blocking layer 181 and the bottom surface of a portion of the 2$^{nd}$ blocking layer 182. Thus, a step-shaped structure may be formed by the end portion 183E of the 3$^{rd}$ blocking layer 183 and the 2$^{nd}$ blocking layer 182. However, unlike as shown in FIG. 2G, the end portion 183E of the 3$^{rd}$ blocking layer 183 may not contact the bottom surfaces of the 1$^{st}$ blocking layer 181 and the portion of the 2$^{nd}$ blocking layer 182.

Still, however, a side surface of the end portion 183E of the 3$^{rd}$ blocking layer 183 may contact the side surface of the uppermost lower inner spacer 116 and the lower side surface of the channel isolation layer 117 not covered by the blocking layers 181 and 182. Thus, the side surfaces of the end portion 183E and the 1$^{st}$ blocking layer 181 are vertically aligned to each other to contact the side surfaces of the uppermost lower inner spacer 116, the channel isolation layer 117 and the lowermost upper inner spacer 126 which are vertically aligned to each other.

The 3$^{rd}$ blocking layer 183 may remain on the top surfaces of the lower source/drain regions 135 even after a 3D-stacked semiconductor device is completed from the intermediate semiconductor device 10, while at least portions of the 1$^{st}$ and 2$^{nd}$ blocking layers 181 and 182 may be removed in a later step, so that the lower source/drain regions 135 can be isolated from other circuit elements of the 3D-stacked semiconductor device.

Referring to FIG. 2H, a 1st source/drain isolation layer 141 may be formed on the lower source/drain regions 135 with the 3rd blocking layer 183 thereon.

The 1st source/drain isolation layer 141 may be formed through, for example, deposition of a silicon oxide (e.g., SiO or $SiO_2$) on the semiconductor stacks 10-1, 10-2 and 10-3 obtained in the previous step so that the recesses R1 and R2 are filled in with the dielectric material. Further, the silicon oxide in the recesses R1 and R2 may be etched down based on the hard mask patterns 161 and the blocking layers 181 and 182 such that a top surface of the 1st source/drain isolation layer 141 formed of the silicon oxide may be at a level that is the same or substantially same as or lower than a top surface of the channel isolation layer 117 or a bottom surface of the lowermost upper sacrificial layer 121 and a bottom surface of the lowermost upper inner spacer 126. Thus, terminal portions T of the 1st and 2nd blocking layers 181 and 182 may be interposed between a lateral side of the 1st source/drain isolation layer 141 and a lateral side of the channel isolation layer 117.

As will be described later, the terminal portion T of the 2nd blocking layer 182 may remain at least until upper source/drain regions are formed in a later step so that the terminal portion of the 2nd blocking layer 182 may prevent the upper source/drain regions to be epitaxially grown from the upper channel layers 122 from reaching downward to the lower source/drain regions 135, which increase a short circuit risk.

Figures 2I, 2J:
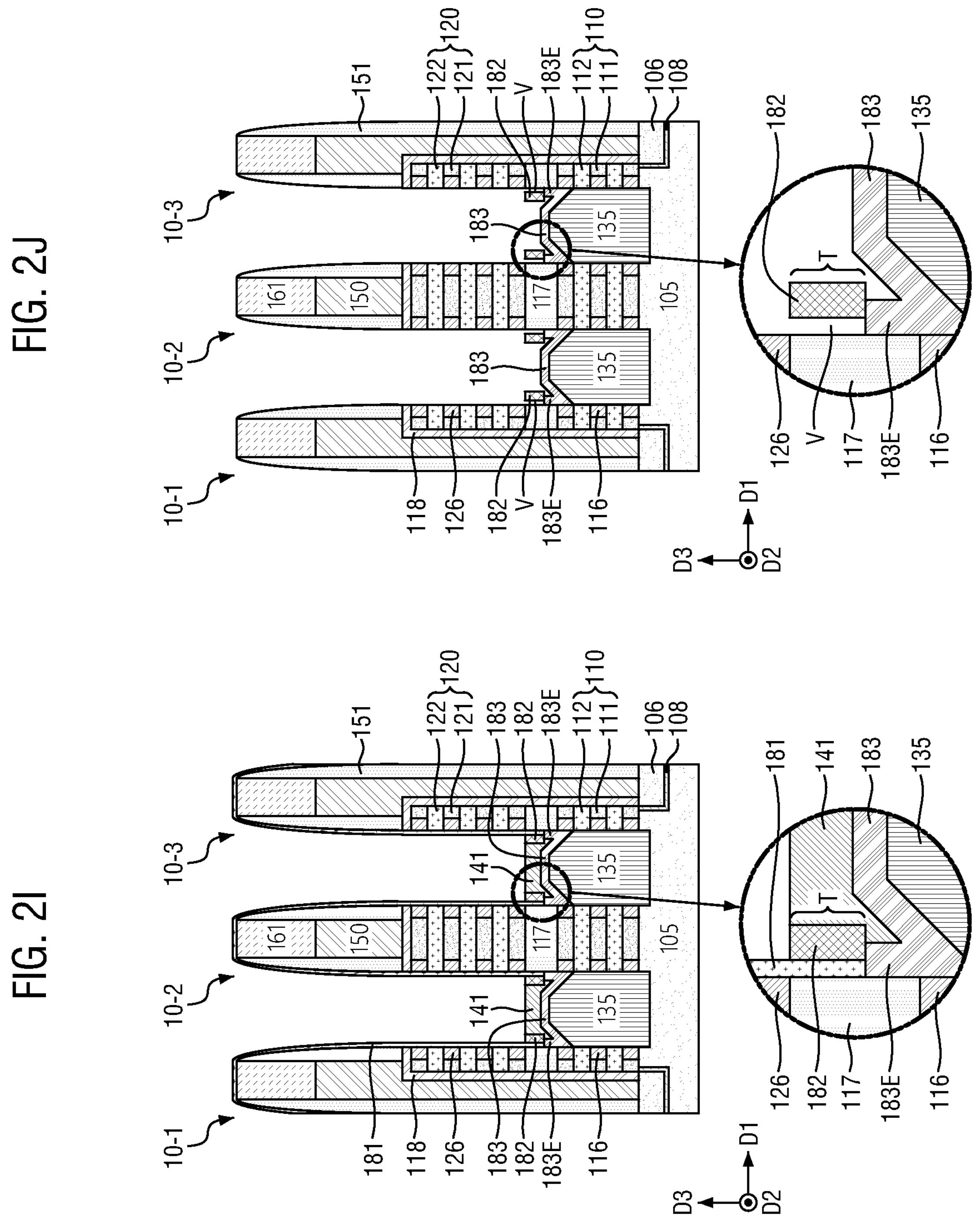

Referring to FIG. 2I, the 2nd blocking layer 182 may be selectively removed against the 1st source/drain isolation layer 141 and the 1st blocking layer 181 through, for example, dry etching or stripping. However, at this time, the terminal portion T of the 2nd blocking layer 182 may remain between at each lateral side of the 1st source/drain isolation layer 141 and the 1st blocking layer 181 while the 2nd blocking layer 182 above a level of the top surface of the 1st source/drain isolation layer 141 is removed.

Referring to FIG. 2J, 1st blocking layer 181 may be removed through, for example, dry etching, so that the upper channel structure 120 including the upper channel layers 122 may be exposed above top surfaces of the 1st source/drain isolation layer 141 and the terminal portion T of the 1st blocking layer 181 and the 2nd blocking layer 182.

Further, the 1st source/drain isolation layer 141 may be removed at least partially in a pre-cleaning operation through, for example, dry etching, wet etching, stripping or ashing, that may be required to prepare for epitaxial growth of the upper channel layers 121 to form upper source/drain regions in a next step.

However, the etching and/or pre-cleaning operations in this step may also remove the terminal portion T of the 1st blocking layer 181 because the 1st source/drain isolation layer 141 and the 1st blocking layer 181 may be formed of the same material such as a silicon oxide (e.g., SiO or $SiO_2$). Thus, the removal of the terminal portion T of the 1st blocking layer 181 may generate a void V (or gap) between the upper side surface of the channel isolation layer 117 and a side surface of the terminal portion T of the 2nd blocking layer 182. The void V may expose the top surface of the end portion 183E of the 3rd blocking layer 183 although it may be open upward in an opposite direction of the end portion 183E of the 3rd blocking layer 193.

Figures 2K, 2L:
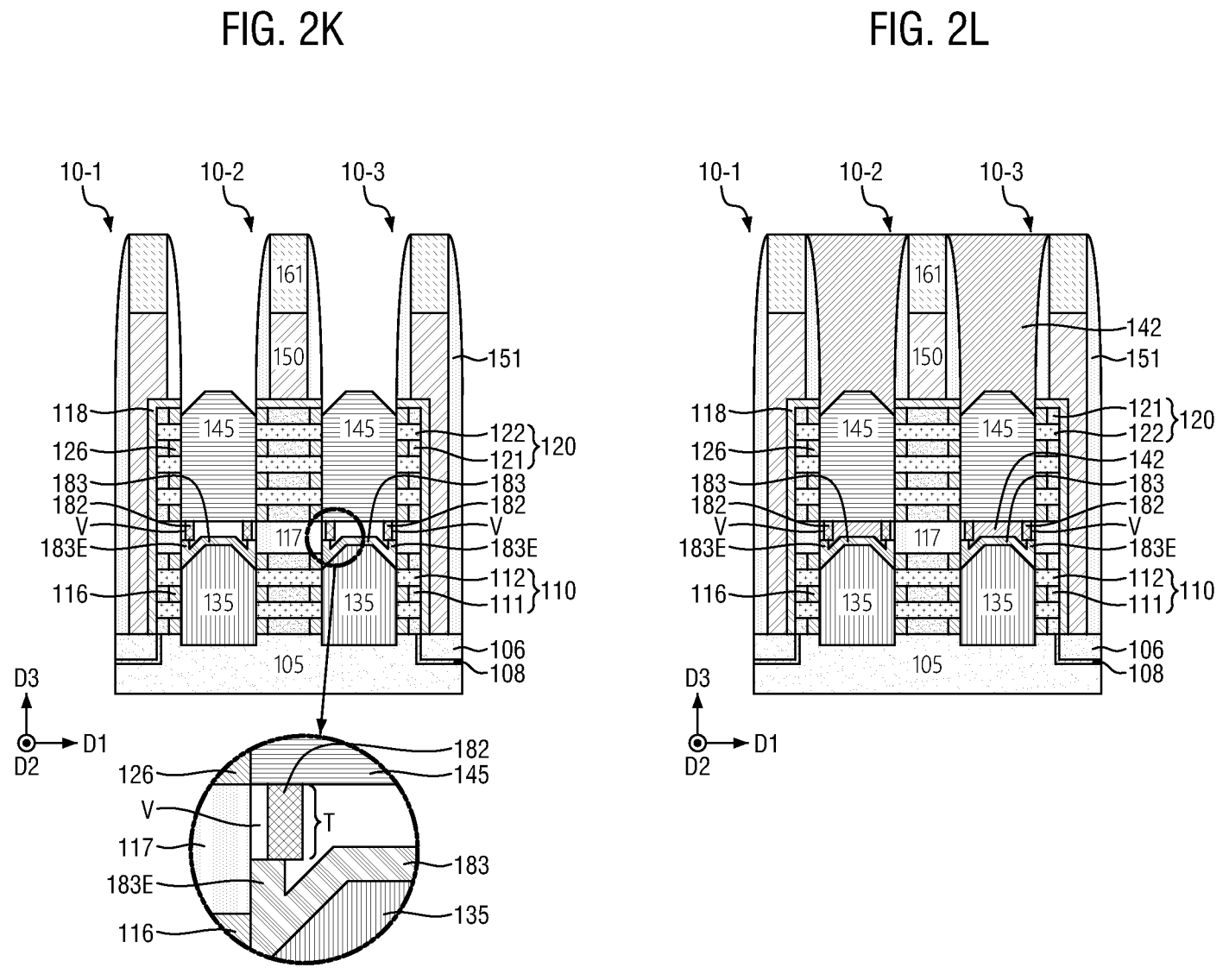

Referring to FIG. 2K, upper source/drain regions 145 may be formed through, for example, epitaxy based on the upper channel layers 122 of the semiconductor stacks 10-1, 10-2 and 10-3. Further, the upper source/drain regions 145 may be doped with impurities such as phosphorus (P), arsenic (As), antimony (Sb), etc. when the upper source/drain regions 145 are to be n-type source/drain regions. However, when the upper source/drain regions 145 are to be p-type source/drain regions, they may be doped with boron (B), gallium (Ga), indium (In), etc.

When a 3D-stacked semiconductor device is completed, a current will flow between the upper source/drain regions 145 through the upper channel layers 122 of the semiconductor stack 10-2 to function an upper transistor of the 3D-stacked semiconductor device.

Referring to FIG. 2L, a 2nd source/drain isolation layer 142 may be formed to surround each of the lower source/drain regions 135 and the upper source/drain regions 145 to isolate each of these source/drain regions from each other or other circuit elements of an integrated circuit including a 3D-stacked semiconductor device to be formed from the intermediate semiconductor device 10.

At this time, a portion of the 2nd source/drain isolation layer 142 may also be formed at a space between the lower source/drain region 135 and the upper source/drain region 145 where the 1st source/drain isolation layer 141 is removed during the pre-cleaning operation in the previous step.

Through the above steps, the lower source/drain regions 135 for a lower transistor and the upper source/drain regions 145 for an upper transistor may be formed and isolated from each other in manufacturing a 3D-stacked semiconductor device. Subsequently, the hard mask patterns 161 may be removed, and the dummy gate structure 150 along with the sacrificial layers 111 and 121 may be replaced by a gate structure for the 3D-stacked semiconductor device.

Here, referring back to FIGS. 2J and 2K, when the upper source/drain regions 145 are epitaxially grown from the upper channel layers 122, the terminal portion T of the 2nd blocking layer 182 may not contain the upper source/drain regions 145 thereabove, and instead, may collapse, which may result in undesired extension of the upper source/drain regions 145 in a downward direction to reach the lower source/drain regions 135. Thus, another embodiment described herebelow provides a 3D-stacked semiconductor device including a strengthened terminal portion T of the 2nd blocking layer 182.

FIGS. 3A-3D illustrate intermediate semiconductor devices obtained after respective steps of manufacturing a 3D-stacked semiconductor device from the intermediate semiconductor device 10 of FIG. 1, according to other embodiments.

Similar to FIGS. 2A-2L, FIGS. 3A-3D also illustrate respective intermediate semiconductor devices in cross-section views in the D1 direction corresponding to the line I-I' shown in FIG. 1.

Figures 3A, 3B:
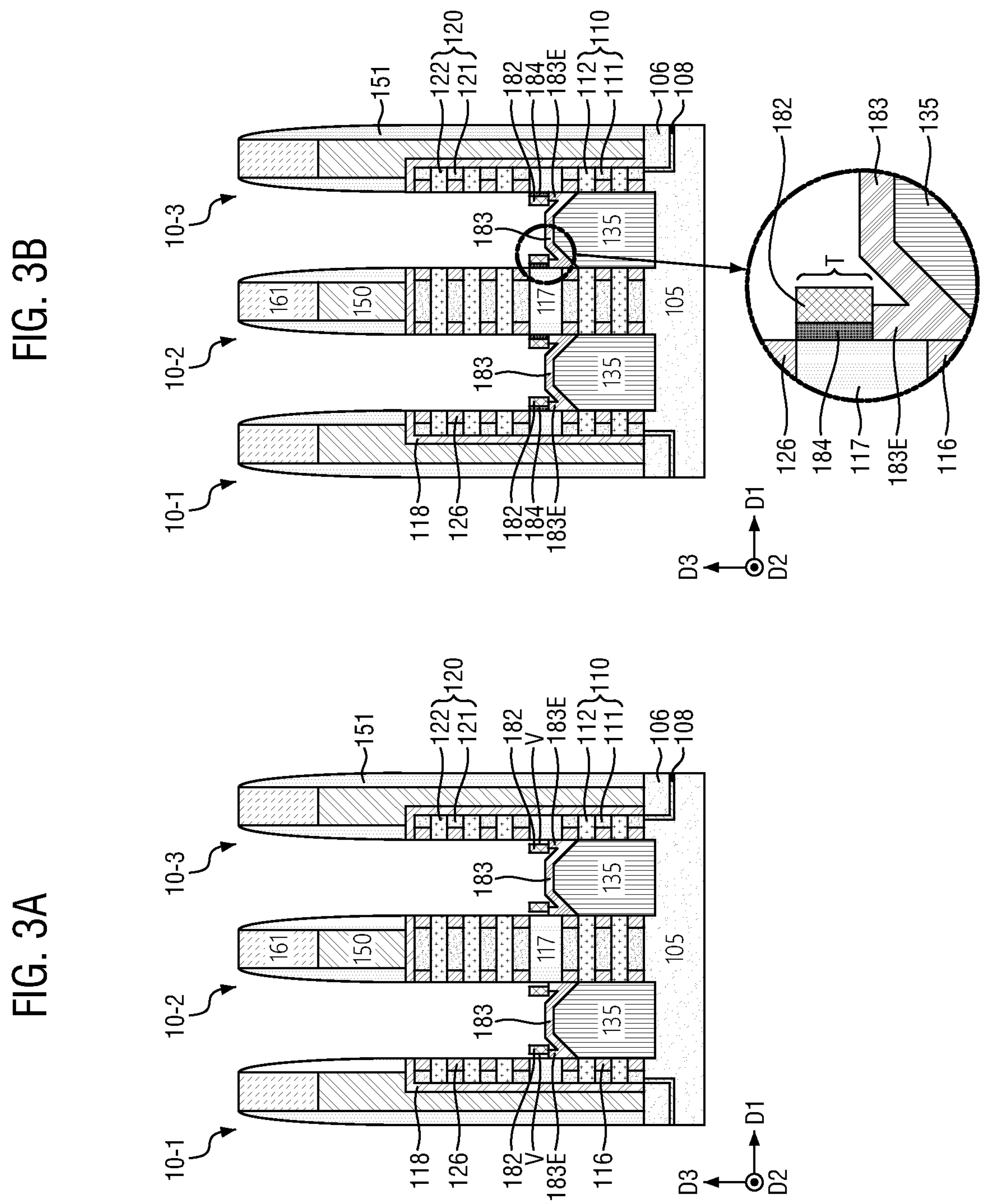
FIGS. 3A-3D illustrate intermediate semiconductor devices obtained after respective steps of manufacturing a 3D-stacked semiconductor device from the intermediate semiconductor device 10 of FIG. 1, according to other embodiments.

Referring to FIG. 3A, an intermediate semiconductor device 20 shown therein is the same as the intermediate semiconductor device 10 shown in FIG. 2J. Also, steps of obtaining the intermediate semiconductor device 20 of FIG. 3A are the same as those described in reference to FIGS. 2A-2I, and thus, duplicate descriptions thereof are omitted herebelow.

Like the intermediate semiconductor device 10 shown in FIG. 2J, the intermediate semiconductor device 20 shown in FIG. 3A also includes the lower source/drain regions 135, above which each of the voids V is formed between the upper side surface of the channel isolation layer 117 and the side surface of the terminal portion T of the remaining 2nd blocking layer 182.

However, unlike in the intermediate semiconductor device 10 in which the upper source/drain region 145 is formed in a state in which each void Vis generated between the remaining blocking layer 182 and the channel isolation layer 117, the present embodiments presents an additional step of filling the void V with a fill structure.

Referring to FIG. 3B, a fill structure 184 may be formed in the void V to support the terminal portion T of the $2^{nd}$ blocking layer 182 so that possible collapse of the terminal portion T of the $2^{nd}$ blocking layer 182 can be avoided when the upper source/drain region 145 is epitaxially grown from the upper channel layers 122 in a next step. The fill structure 184 may be formed of a material such as a silicon nitride (e.g., SiN or $Si_3N_4$) which is included in the $2^{nd}$ blocking layer 183, and an operation of filling the void V with this material may be performed through, for example, chemical vapor deposition (CVD), plasma enhanced chemical vapor deposition (PECVD), atomic layer deposition (ALD), etc., not being limited thereto. Thus, the terminal portion T of the $2^{nd}$ blocking layer 182 and the fill structure 184 thereon may form a new blocking structure BL.

Even though the fill structure 184 may include the same material as that of the $2^{nd}$ blocking layer 183, there may be formed a structural boundary or interface between the fill structure 184 and the terminal portion T of the $2^{nd}$ blocking layer 182 because the fill structure 184 is newly formed at a side surface of the terminal portion T of the $2^{nd}$ blocking layer.

Figures 3C, 3D:
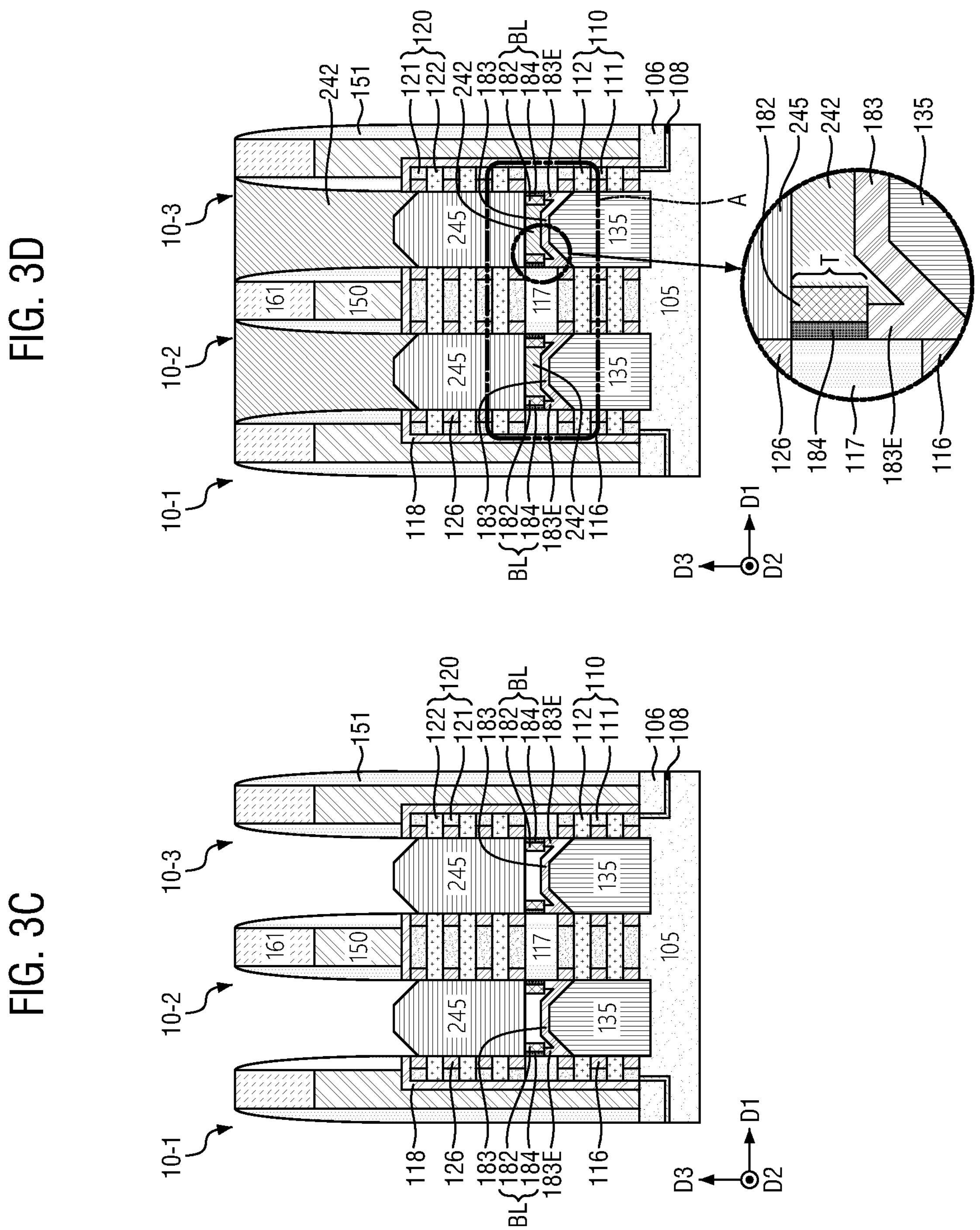

Referring to FIG. 3C, upper source/drain regions 245 may be formed with the blocking structure BL therebelow. The upper source/drain regions 245 may include the same material and impurities as the upper source/drain regions 145 of the intermediate semiconductor device 10 and may be formed through the same process. Thus, duplicate descriptions thereof are omitted herein.

As the terminal portion T of the $2^{nd}$ blocking layer 182 is supported by the fill structure 184 to form the blocking structure BL, the terminal portion T of the $2^{nd}$ blocking layer 182 may avoid possible collapse during the formation of the upper source/drain regions 245. Thus, the blocking structure BL may better prevent the upper source/drain regions 245 from growing downward to reach the lower source/drain regions 135.

Referring to FIG. 3D, a $2^{nd}$ source/drain isolation layer 242 may be formed to surround each of the lower source/drain regions 135 and the upper source/drain regions 245 to isolate each of these source/drain regions from each other and from other circuit elements of an integrated circuit including a 3D-stacked semiconductor device to be formed from the intermediate semiconductor device 20.

Thus, in the 3D-stacked semiconductor device to be formed from the intermediate semiconductor device 20 may include the lower source/drain region 135 and the upper source/drain region 245 isolated from each other by the $2^{nd}$ source/drain isolation layer which is strengthened by the blocking structure BL which is a combination of the terminal portion T of the $2^{nd}$ blocking layer 182 and the fill structure 184.

Figure 4:
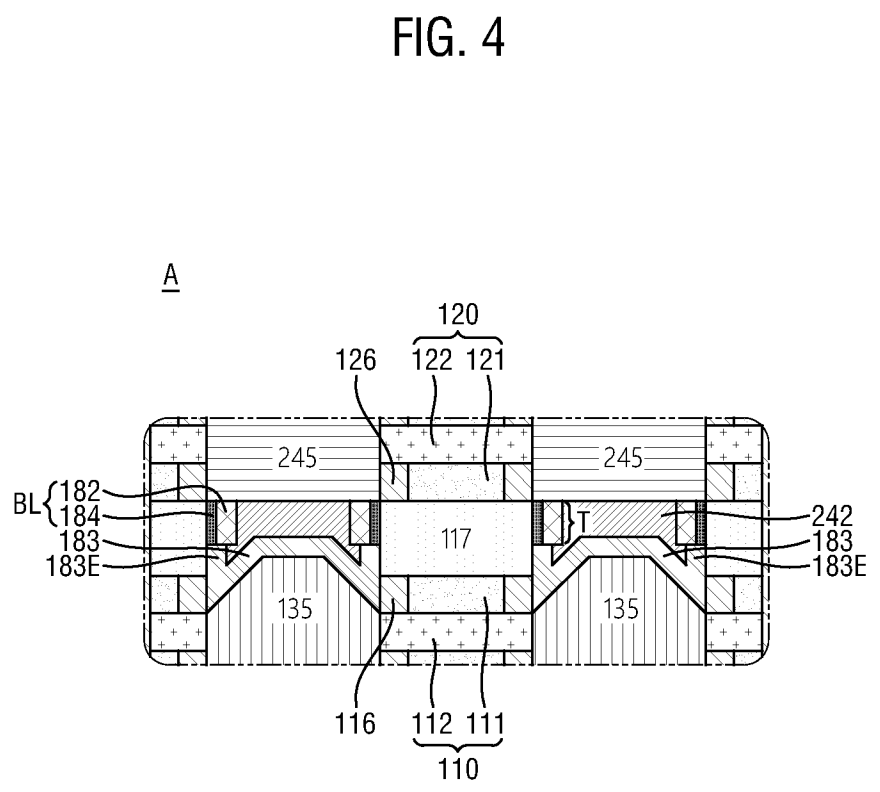

FIG. 4 illustrates an enlarged view of a portion A of the intermediate semiconductor device 20 shown in FIG. 3D.

Referring to FIG. 4, each of the $2^{nd}$ source/drain isolation layers 242 is strengthened at its lateral sides by the blocking structure BL, which is a combination of the terminal portion T of the $2^{nd}$ blocking layer 182 and the fill structure 184. The blocking structure BL may have a shape of protrusion protruded from a plain side surface of the channel isolation layer 117 toward the $2^{nd}$ source/drain isolation layer 242.

The blocking structure BL may also be formed above the end portion 183E of the $3^{rd}$ blocking layer 183 and below a lateral edge portion of the upper source/drain region 245. For example, an entire width of the blocking structure BL in the D1 direction may be vertically overlapped by the lateral edge portion of the upper source/drain region 245. However, the blocking structure BL may not be vertically overlapped by the inner spacers 116, 126 and the channel layers 112, 122. This structural shape is obtained because the $1^{st}$ blocking layer 181 with the $2^{nd}$ blocking layer 182 thereon is layered on the patterned semiconductor stacks 10-1, 10-2 and 10-3 as shown in FIGS. 2C and 2D.

As the fill structure 194 is formed to fill in the void V between the upper side surface of the channel isolation layer 117 and the side surface of the terminal portion T of the $2^{nd}$ blocking layer 182, a side surface of the fill structure 184 may contact the side surface of the terminal portion T of the $2^{nd}$ blocking layer 182 to form the blocking structure BL, and the other side surface of the fill structure 184 may contact the upper side surface of the channel isolation layer 117. At this time, the other side surface of the fill structure 184 and a side surface of the end portion 183E of the $3^{rd}$ blocking layer 183 may be vertically aligned or coplanar to each other and contact the side surface of the channel isolation layer 117. Further, the other side surface of the fill structure 184 may be vertically coplanar or aligned with the side surfaces of the inner spacers 116 and 126 and the channel layers 112 and 122.

As described earlier, although the fill structure 184 may be formed of the same material forming the $2^{nd}$ blocking layer 182, a boundary or interface may be formed between the two structural elements because they are formed at different steps.

FIG. 5 illustrates a flowchart describing a method of forming lower source/drain regions and upper source/drain regions for a 3D-stacked semiconductor device, according to an embodiment. This method is described herebelow in reference to FIGS. 1, 2A-2I and 3A-3D, and thus, the same reference numbers may be used.

In step S10, an initial semiconductor stack including a lower channel structure 110 and an upper channel structure 120, with a channel isolation layer 117 therebetween may be patterned to provide a $1^{st}$ semiconductor stack 10-1, a $2^{nd}$ semiconductor stack 10-2 and a $3^{rd}$ semiconductor stack 10-3 on a substrate 105 (FIG. 2A).

The $1^{st}$ semiconductor stack 10-1 and the $2^{nd}$ semiconductor stack 10-2 may be divided by a $1^{st}$ recess R1, and the $2^{nd}$ semiconductor stack 10-2 and the $3^{rd}$ semiconductor stack 10-3 may be divided by a $2^{nd}$ recess R2. The recesses R1 and R2 may expose therein side surfaces of the lower channel structure 110 and the upper channel structure 120 of the semiconductor stacks 10-1, 10-2 and 10-3.

In step S20, a passivation structure 171 may be formed at a lower portion of the recesses R1 and R2 to passivate the lower channel structures 110, and a $1^{st}$ blocking layer 181 with a $2^{nd}$ blocking layer 182 thereon may be conformally formed on each of the semiconductor stacks 10-1, 10-2 and 10-3 to block at least the side surfaces of the upper channel structures 120 (FIGS. 2B-2D).

In step S30, the passivation structure 171 may be removed to expose the side surfaces of the lower channel structures 110, and lower source/drain regions 135 for a lower transistor of the 3D-stacked semiconductor device may be formed based on the lower channel structures 110 (FIGS. 2E-2F).

In step S40, a $3^{rd}$ blocking layer 183 may be formed on a top surface of each of the lower source/drain regions 135, and a $1^{st}$ source/drain isolation layer 141 may be formed on the lower source/drain regions 135 with the $3^{rd}$ blocking layer 183 thereon (FIGS. 2G-2H).

At this time, the 1$^{st}$ source/drain isolation layer 141 may be formed at a side of terminal portions T of the 1$^{st}$ and 2$^{nd}$ blocking layers 181 and 182.

In step S50, the 1$^{st}$ and 2$^{nd}$ blocking layers 181 and 182 may be removed from the side surfaces of the upper channel structures 120 except the terminal portions T of the 1$^{st}$ and 2$^{nd}$ blocking layers 181 and 182 (FIG. 2I).

In step S60, the terminal portion T of the 1$^{st}$ blocking layer 181 may be removed to generate a void V (or gap) between each of the channel isolation layers 117 and the terminal portion T of the 2$^{nd}$ blocking layer 182 during a pre-cleaning operation which removes at least a portion of the 1$^{st}$ source/drain isolation layer because the 1$^{st}$ source/drain isolation layer and the 1$^{st}$ blocking layer 181 may be formed of the same material such as a silicon oxide (FIG. 3A).

In step S70, a fill structure may be formed in the void V to support the terminal portion T of the 2$^{nd}$ blocking layer 182 to collectively form a blocking structure BL so that the 2$^{nd}$ blocking layer 182 may not collapse when upper source/drain regions are formed from above the 2$^{nd}$ blocking layer 182 in a next step (FIG. 3B).

In step S80, upper source/drain regions 245 may be formed for an upper transistor of the 3D-stacked semiconductor device based on the upper channel structures 110, and a 2$^{nd}$ source/drain isolation layer may be formed between the lower source/drain regions 135 and the upper source/drain regions 245 (FIGS. 3C-3D).

When the upper source/drain regions 245 are formed, the blocking structure BL may prevent growth of the upper source/drain regions 245 toward the lower source/drain regions 135.

In the above embodiments, a 3D-stacked semiconductor device formed from the intermediate semiconductor device 20 is described as including of nanosheet field-effect transistors at lower and upper stacks. However, the disclosure is not limited thereto, and at least one of the lower and upper transistors of the 3D-stacked semiconductor device may be implemented by a FinFET or another type of transistor.

Figure 6:
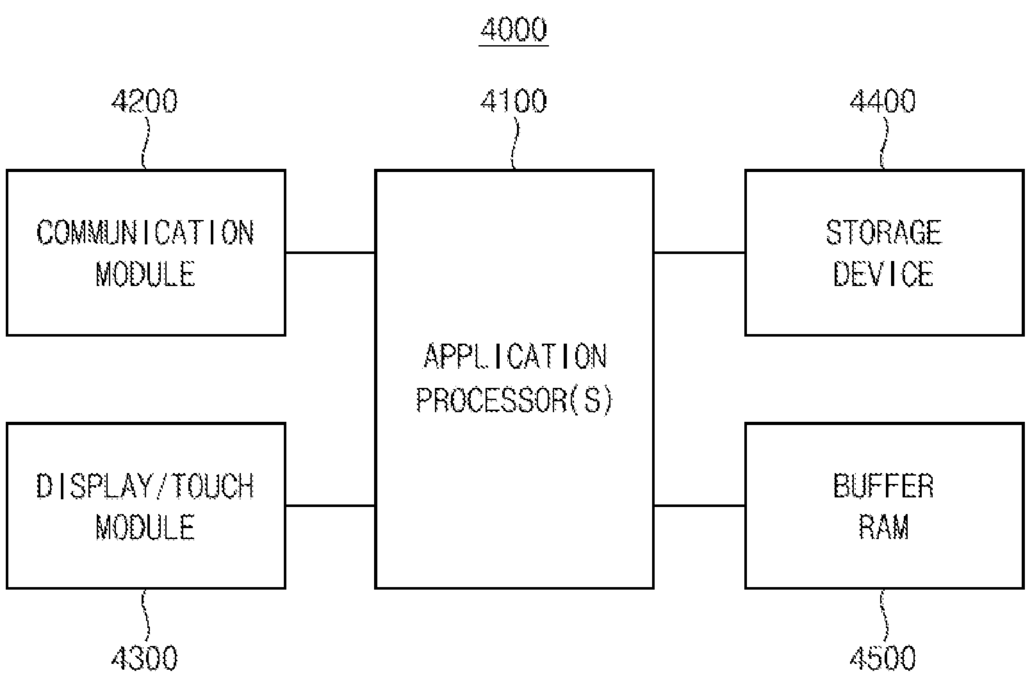
FIG. 6 is a schematic block diagram illustrating an electronic device including a 3D-stacked semiconductor device including a strengthened source/drain isolation layer, according to an example embodiment.

FIG. 6 is a schematic block diagram illustrating an electronic device including a 3D-stacked semiconductor device including a strengthened source/drain isolation layer, according to an example embodiment.

Referring to FIG. 6, an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include a 3D-stacked semiconductor device completed from the intermediate semiconductor device 10 shown in FIGS. 3D and 4.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A semiconductor device comprising:
- a 1$^{st}$ source/drain region connected to a 1$^{st}$ channel structure;
- a 2$^{nd}$ source/drain region, above the 1$^{st}$ source/drain region, connected to a 2$^{nd}$ channel structure above the 1$^{st}$ channel structure;
- a channel isolation layer between the 1$^{st}$ channel structure and the 2$^{nd}$ channel structure;
- a source/drain isolation layer between the 1$^{st}$ source/drain region and the 2$^{nd}$ source/drain region; and
- a blocking structure between the channel isolation layer and the source/drain isolation layer,
- wherein an entire width of the blocking structure in a channel-length direction is vertically below a lateral edge portion of the 2$^{nd}$ source/drain region, and
- wherein the blocking structure is a physically non-monolithic structure.

2. The semiconductor device of claim 1, wherein a side surface of the blocking structure contacting the channel isolation layer is vertically aligned with a side surface of the 2$^{nd}$ channel structure.

3. The semiconductor device of claim 1, wherein the blocking structure comprises a 1$^{st}$ portion contacting the source/drain isolation layer and a 2$^{nd}$ portion contacting the channel isolation layer, and
- wherein the 1$^{st}$ portion and the 2$^{nd}$ portion have a structural boundary therebetween.

4. The semiconductor device of claim 3, wherein the 1$^{st}$ and 2$^{nd}$ portions of the blocking structure comprise a same material.

5. The semiconductor device of claim 4, wherein the same material comprises a silicon nitride.

6. The semiconductor device of claim 5, wherein the channel isolation layer and the source/drain isolation layer comprise different materials.

7. The semiconductor device of claim 6, wherein the channel isolation layer comprises a silicon nitride, and the source/drain isolation layer comprises a silicon oxide.

8. The semiconductor device of claim 1, further comprising a blocking layer on a top surface of the 1$^{st}$ source/drain region,
- wherein the blocking structure is formed above an end portion of the blocking layer.

9. A semiconductor device comprising:
- a 1$^{st}$ source/drain region connected to a 1$^{st}$ channel structure;
- a 2$^{nd}$ source/drain region, above the 1$^{st}$ source/drain region, connected to a 2$^{nd}$ channel structure above the 1$^{st}$ channel structure;
- a channel isolation layer between the 1$^{st}$ channel structure and the 2$^{nd}$ channel structure;
- a source/drain isolation layer between the 1$^{st}$ source/drain region and the 2$^{nd}$ source/drain region; and a blocking structure between the channel isolation layer and the source/drain isolation layer, wherein the blocking structure comprises a $1^{st}$ portion and a $2^{nd}$ portion contacting each other with a physical interface therebetween.

10. The semiconductor device of claim 9, wherein the $1^{st}$ portion contacts the source/drain isolation layer, and the $2^{nd}$ portion contacts the channel isolation layer.

11. The semiconductor device of claim 10, wherein the $1^{st}$ and $2^{nd}$ portions of the blocking structure comprise a same material.

12. The semiconductor device of claim 11, wherein the same material comprises a silicon nitride.

13. The semiconductor device of claim 9, wherein an entire width of the blocking structure in a channel-length direction is vertically below a lateral edge portion of the $2^{nd}$ source/drain region.

14. The semiconductor device of claim 13, wherein the blocking structure is not vertically overlapped by the $1^{st}$ or $2^{nd}$ channel structure.

15. A method of manufacturing a semiconductor device, the method comprising:

providing a semiconductor stack comprising a $1^{st}$ channel structure, a channel isolation layer and a $2^{nd}$ channel structure stacked in this order on a substrate;

forming a $1^{st}$ source/drain region based on the $1^{st}$ channel structure;

forming a blocking structure on a side surface of the channel isolation layer above a lateral edge portion of the $1^{st}$ source/drain region by multiple processes;

forming a $2^{nd}$ source/drain region based on the $2^{nd}$ channel structure from above the blocking structure; and forming a source/drain isolation layer between the $1^{st}$ source/drain region and the $2^{nd}$ source/drain region, wherein an entire width of the blocking structure in a channel-length direction is vertically below a lateral edge portion of the $2^{nd}$ source/drain region, wherein the blocking structure comprises a $1^{st}$ portion and a $2^{nd}$ portion contacting each other with a structural boundary therebetween, and wherein the $1^{st}$ portion is formed before the $1^{st}$ source/drain region is formed, and the $2^{nd}$ portion is formed after the $1^{st}$ source/drain region is formed.

16. The method of claim 15, further comprising forming an inner spacer on a side surface of the $2^{nd}$ channel structure such that a side surface of the inner spacer is vertically aligned with a side surface of the channel isolation layer, the inner spacer being configured to isolate a gate structure of the semiconductor device from the $2^{nd}$ source/drain region, wherein the blocking structure is not vertically overlapped with the inner spacer.

17. The method of claim 15, wherein the $1^{st}$ and $2^{nd}$ portions of the blocking structure comprise a same material.

18. The method of claim 17, wherein the same material comprises a silicon nitride.

* * * * *